United States Patent
Fernandez et al.

(10) Patent No.: US 7,796,075 B2
(45) Date of Patent: Sep. 14, 2010

(54) METHOD AND APPARATUS FOR INTERNALLY CALIBRATING MIXED-SIGNAL DEVICES

(76) Inventors: Benito R. Fernandez, 3112 Thousand Oaks Dr., Austin, TX (US) 78746; Zhaohong Wu, 3723 Falling Rock ln., Katy, TX (US) 77494

( * ) Notice: Subject to any disclaimer, the term of this patent is extended or adjusted under 35 U.S.C. 154(b) by 139 days.

(21) Appl. No.: 11/742,465

(22) Filed: Apr. 30, 2007

(65) Prior Publication Data

US 2010/0013685 A1    Jan. 21, 2010

Related U.S. Application Data

(60) Provisional application No. 60/796,213, filed on Apr. 28, 2006.

(51) Int. Cl.
 *H03M 1/78* (2006.01)

(52) U.S. Cl. .................................. 341/154; 341/120
(58) Field of Classification Search .......... 341/140–170
 See application file for complete search history.

(56) References Cited

U.S. PATENT DOCUMENTS

| | | | | |
|---|---|---|---|---|
| 6,997,610 B2 * | 2/2006 | Heismann | ..................... | 378/207 |
| 7,130,756 B2 * | 10/2006 | Heuermann | .................. | 702/107 |
| 2010/0054588 A1 * | 3/2010 | Simson et al. | ............... | 382/167 |

* cited by examiner

*Primary Examiner*—Lam T Mai

(57) ABSTRACT

A method to tune electronic devices in general using R/2R ladder networks to obtain fixed or variable accurate properties that may include, but are not limited to resistance, current, voltage, and/or timing. As a particular application, a method for internally calibrating a digital-to-analog converter is shown in detail. The DAC uses an extended R/2R ladder to improve the converting accuracy by mapping the extended bits into the original bits. A mapping matrix is maintained, which can be rewritten by an internal calibration process.

8 Claims, 4 Drawing Sheets

Initialize the capacitor voltage ($V_c$) to ground.
Stop Counter.
Loop 1:  $i = 0:2^n - 1$             % n is the number of original bits
    Loop 2:  $j = 0:(n+m)$            % m is the number of extended bits
        1) Fetch counter $t_1$;
        2) Set Source as $V_{dac}$, set Integrate on, start counter (set Enable true);
        3) Hold a certain time T/2, Vc increases
        4) Fetch counter $t_2$, set Integrate off, stop counter (set Enable false);
        5) Set Source as $V_{ref}$, start counter (set Enable true);
        6) Hold until $V_c$ decreasing to ground; (Cycle over becomes true)
        7) Fetch counter $t_3$, (set Enable false);
        8) If $((t_3-t_2)/(t_2-t_1) < i/2^n)$
                Set mapping matrix element $M_{i\,j} = 1$;
            Else
                $M_{ij} = 0$;
    Goto Loop2
Goto Loop1

Figure 4

METHOD AND APPARATUS FOR INTERNALLY CALIBRATING MIXED-SIGNAL DEVICES

BACKGROUND OF THE INVENTION

1. Technical Field

The present invention relates to a method and apparatus for internally calibrating mixed-signal electronic devices that use resistors as part of their design, and in particular to a method and apparatus for internally calibrating a digital-to-analog converter. The calibration method tunes the electronic devices using an extended R/2R ladder network to obtain improved accuracy in resistance, current, voltage, timing, etc.

2. Description of Related Art

Many mixed-signal electronic devices utilize resistances to perform a variety of functions such as voltage and current regulation, timing circuitry, etc. Due to manufacturing errors and changes of the parameters with operating conditions (temperature) the desired function may not be realized precisely. By adding an R/2R ladder and additional circuitry for detection of changes and calibration, the device can self-adjust the ladder switches to improve the device's functionality. For example, R/2R ladder networks provide a simple means to convert digital information to an analog output.

Referring now to the drawings and in particular to FIG. 1, there is depicted a conventional R/2R Digital to Analog converter. Digital information can be presented to the ladder as individual bits of a digital word switched between a reference voltage ($V_r$) and ground. Depending on the number and location of the bits switched to $V_r$ or ground, $V_{out}$ will vary between 0 volts and $-V_r$. If all inputs are connected to ground, 0 volts is produced at the output, if all inputs are connected to $V_r$, the output voltage approaches $-V_r$, and if some inputs are connected to ground and some to $V_r$ then an output voltage between 0 volts and $-V_r$ occurs. These inputs (also called bits in the digital parlance) range from the most significant bit (MSB) to the least significant bit (LSB). The MSB, when activated, causes the greatest change in the output voltage and the LSB, when activated, will cause the smallest change in the output voltage. If we label the bits (or inputs) bit 1 to bit n, the output voltage caused by connecting a particular bit to $V_r$ with all other bits grounded is:

$$V_{out}=V_r/2^n \qquad (1)$$

where n is the bit number.

Since an R/2R ladder is a linear circuit, we can apply the principle of superposition to calculate $V_{out}$. The expected output voltage is calculated by summing the effect of all bits connected to $V_r$.

When specifying an R/2R ladder, consideration must be given to the accuracy of the ladder output as well as the resolution of the R/2R ladder in bits. The ratio tolerances of the individual resistors within the R/2R ladder, the resistance of the switches used at the R/2R ladder inputs and the possible resister degradation all can affect the output accuracy of a DAC.

The ladder operates as an array of voltage dividers and their output accuracies are solely dependent on how well each resistor is matched to the others. Ideally, resistors within the ladder are matched so that the voltage ratio for a given bit is exactly half of that for the preceding bit. In Practice the output accuracy of the R/2R ladder can be affected by the ratio tolerances of the individual resistors within the R/2R ladder. It is very possible that voltage output tolerances from each individual bit add up to a level that requires attention for some sensitive applications, e.g., high definition audio digitizing and decoding.

R/2R inputs are switched between ground and $V_r$ in order to create the digital word that is converted to an analog voltage output. In practical applications, these switches (usually solid state) carry some nominal resistance. Actual switch resistances can be as high as 50 ohms in some devices. Since the switch is connected in series to the 2R resistor, the switch resistance ($R_{sw}$) affects the value of the 2R leg of the circuit and thus, the output accuracy of the R/2R ladder.

The resistances of the components can be affected by environments such as temperature, magnetic fields, etc. As such, malfunction of the resistors are also possible because of wearing out from time. Consequently, it is desirable to provide a method and apparatus for internally calibrating a DAC. The calibration can be triggered by an instruction from a user or by the sensing of the environmental changes automatically.

SUMMARY OF THE INVENTION

In accordance with a preferred embodiment of the present invention, All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 4 is a logic flow diagram of a method for maintaining a mapping matrix shown in FIG. 2, in accordance with a preferred embodiment of the present invention.

DETAILED DESCRIPTION OF A PREFERRED EMBODIMENT

The method of the present invention is to extend the number of bits of a R/2R ladder, and the original binary set is converted into an analog voltage by mapping the original binary set into an extended binary set that is adopted to configure the R/2R ladder circuitry. A mapping matrix between the original bits and the extended bits are then generated. The number of the columns equals to the bit count of the extended R-2R ladder, and the $i^{th}$ row of the matrix represents the extended binary set mapped to the original binary set whose decimal value is i. If there are n bits in the original R/2R ladder, then the number of rows is equal to $2^n$. A searching algorithm is needed to optimally setup each row of the matrix to have the voltage output closest to an ideal voltage.

Figure 2:
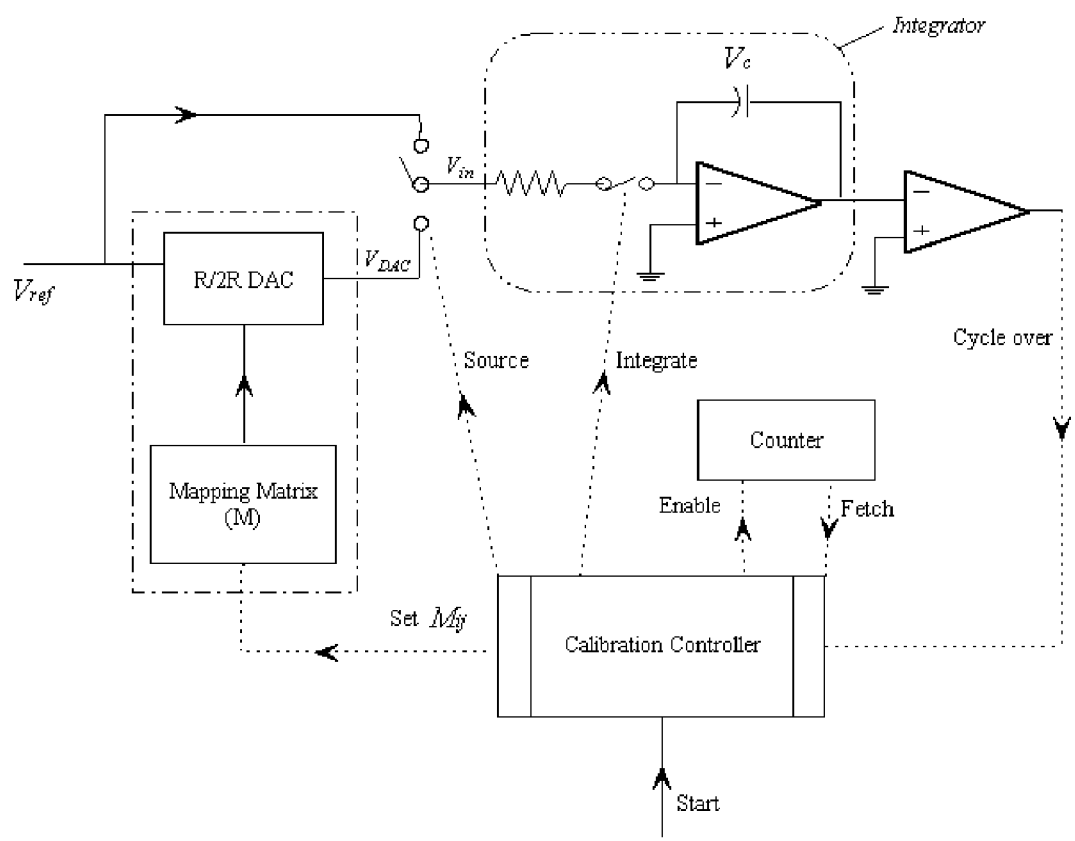
FIG. 2 is a block diagram of an internal calibrated DAC, in accordance with a preferred embodiment of the present invention.

The functional scheme of the self-calibrated DAC is shown in FIG. 2, wherein an integrator composed of a resistor, an operational amplifier, and a capacitor can be subject to an input voltage, $V_{DAC}$ or $V_{ref}$, which is controlled by a switch "Source" as denoted. Another switch "Integrate" is used to pause the whole process intermittently when the voltage of the capacitor is hold at the ground level without increase or decrease.

Figure 3:
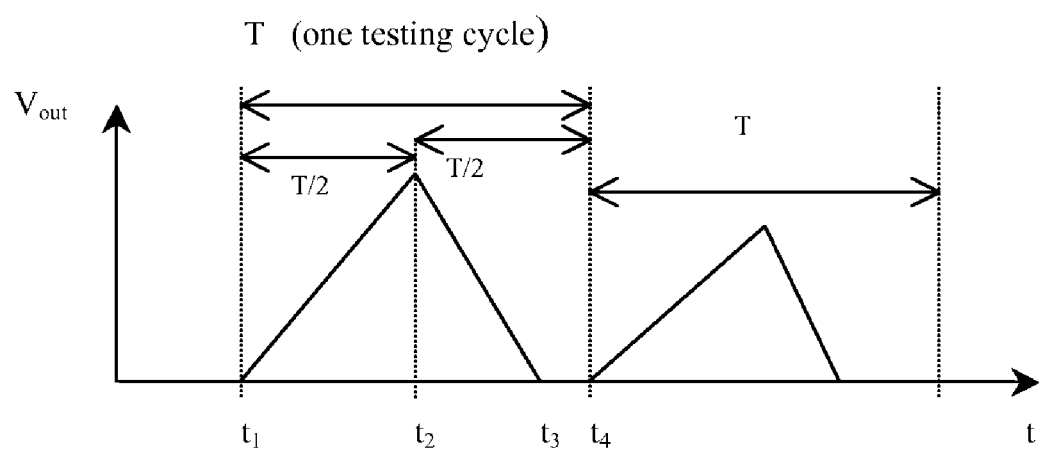
FIG. 3 is a diagram showing the periodic voltage increase and decrease integrator during a testing cycle, in accordance with a preferred embodiment of the present invention.

As shown in FIG. 3, a testing cycle is used to set up a cell of the mapping matrix. Each testing cycle includes a process of charging the capacitor by $V_{in}=V_{DAC}$ from ground voltage, and followed by another process of discharging the capacitor by $V_{in}=V_{ref}$ to ground voltage. Another operational amplifier as shown in the top right of FIG. 2 is used to compare the voltage of the capacitor $V_c$ with ground. Here the $V_{ref}$ is set as a negative voltage, thus $V_{DAC}$ is positive as the output of the traditional R/2R DAC.

The increased voltage (charging process) is equal to the decreased voltage (discharging process), as shown in equation (2), which suggests that, as in equation (3), the $V_{DAC}$ can be measured or represented by the duration $(t_2-t_1)$ and $(t_3-t_2)$ for charging and discharging process respectively given the $V_{ref}$ Value. Here $t_1$ is the instance when the integrator output voltage $V_{out}$ starts increasing from ground; $t_2$ is the instance when $V_{out}$ finished the increasing process; and $t3$ is the instance when $V_{out}$ drops back to the ground voltage.

$$\frac{V_{DAC}}{RC}*(t_2-t1)=-\frac{V_{ref}}{RC}(t_3-t_2) \qquad (2)$$

$$V_{DAC}=-\frac{t_3-t_2}{t_2-t_1}*V_{ref} \qquad (3)$$

Based on the above mentioned testing cycle, an algorithm of maintaining the mapping matrix is shown in FIG. 4, which is the logic implemented in the box "Calibration Controller" that is shown in FIG. 2. In FIG. 4, loop 1 goes through the rows of the mapping matrix, loop 2 goes through the columns of the mapping matrix, and the bold words in FIG. 4 are the signal controls denoted in FIG. 2.

For an extended n bits binary set (or a row of the mapping matrix), there are $2^n$ different combinations. The one that has the integrator voltage output $(V_{out})$ closest to the ideal $(V_{ideal})$ is to be searched. By gradually validating one more bit each time in the order of significance (i.e., from MSB to LSB), the voltage output keeps increasing, although the amount of increase becomes lower and lower. Due to such monotonic treat of the solution space, this searching algorithm guarantees to find the best binary setting with only approximately n comparisons [O(n)].

Figure 1:
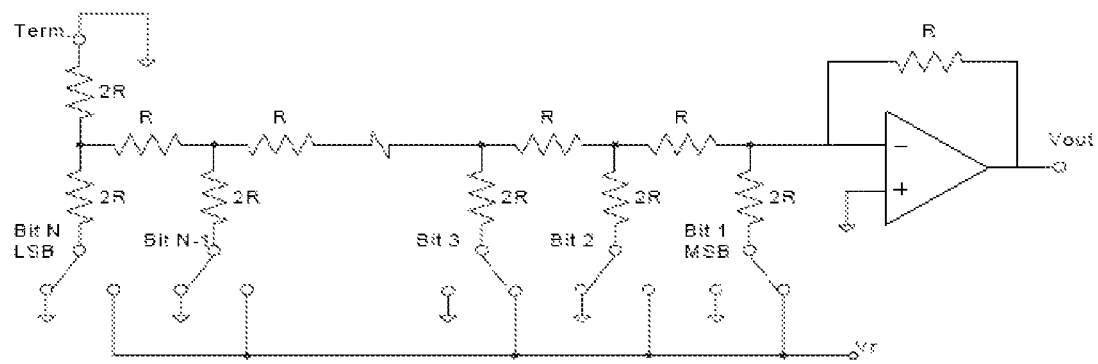
FIG. 1 is a diagram of a digital to analog converter (DAC) using a R/2R ladder network, according to the prior art.

This paragraph details the process of tuning a row of the mapping matrix. The bits of a row will be scanned sequentially to decide how to set each bit. The scanning process starts with all bits set as 0, implying all switches of the R/2R ladder are grounded. Then the current bit, the most significant bit (MSB) at the left of the row, is set to 1, which means the switch at the current bit of FIG. 1 is connected to $V_{ref}$. Within a testing cycle as described above, the time instances $t_1$, $t_2$, $t_3$ can be recorded using a counter. According to the output voltage $V_{DAC}$ calculated from equation (3), if $V_{DAC}$ is greater than the $V_{ideal}$, the temporary best setting, $S_{temp\_best}$, is updated using the current row binary set, and the $V_{DAC\_temp\_best}$ is updated using the current $V_{DAC}$ for the purpose of latter comparison as the scanning of this entire row ends, then the current bit is set back to 0, and meanwhile the bit next to it is set as 1. If $V_{DAC}$ is smaller than $V_{ideal}$, the current bit will remain as 1 and the bit next to it will be set as 1. Then the current bit move down and the entire process repeats until the last bit test cycle finishes with $V_{DAC\_last}$ and $S_{last}$. The better one of $V_{DAC\_last}$ and $V_{DAC\_temp\_best}$ will be chosen and the corresponding binary setting, $S_{last}$ or $S_{temp\_best}$ will be finally stored in the matrix row.

At the beginning of the calibration process (before $t_1$ of the first testing cycle), $V_{out}$ needs to be initialized as ground voltage, which is achieved by a discharging or charging process that ends whenever $V_{out}$ arrives ground voltage.

As has been described, the present invention provides a method and apparatus for internally calibrating a DAC.

While the invention has been particularly shown and described with reference to a preferred embodiment, it will be understood by those skilled in the art that various changes in form and detail may be made therein without departing from the spirit and scope of the invention.

What is claimed is:

1. A method for internally calibrating a mixed-signal electronic device having a resistor ladder, said method comprising:
    adding an extra set of bits (0 to any practical number) to an original set of bits within said resistor ladder;
    generating a mapping matrix between an extended set of bits and said original set of bits, each element of said mapping matrix can be 0 or 1, which controls a switch in a R/2R DAC, a total number of switches is equal to a number of the extended set of bits;
    tuning each row within said mapping matrix to have an functional requirement closest to an ideal function associated with that row.

2. A method for internally calibrating a mixed-signal electronic device, with a resistor whose magnitude provides a critical functionality, replacing this original resistor with a resistor ladder, said method comprising:
    adding an extra set of bits (0 to any practical number) to an original set of bits within said resistor ladder;
    generating a mapping matrix between an extended set of bits and said original set of bits, each element of said mapping matrix can be 0 or 1, which controls a switch in a R/2R DAC, a total number of switches is equal to a number of the extended set of bits;
    tuning each row within said mapping matrix to have an functional requirement closest to an ideal function associated with that row.

3. A method for internally calibrating a digital-to-analog converter having a resistor ladder, said method comprising:
    adding an extra set of bits (0 to any practical number) to an original set of bits within said resistor ladder;
    generating a mapping matrix between an extended set of bits and said original set of bits, each element of said mapping matrix can be 0 or 1, which controls a switch in a R/2R DAC, a total number of switches is equal to a number of the extended set of bits;
    tuning each row within said mapping matrix to have an output voltage closest to an ideal voltage associated with that row.

4. A method for internally calibrating a mixed-signal electronic device, as claim 1 or 2 with critical functionality related to a timing function.

5. A method for internally calibrating a mixed-signal electronic device, as claim 1 or 2 with critical functionality related to a function that generates a desired current.

6. A method for internally calibrating a mixed-signal electronic device, as claim 1 or 2 with critical functionality related to a function that generates a desired voltage.

7. A method for internally calibrating a mixed-signal electronic device, as claim 1 or 2 with critical functionality related to a function that generates a desired time constant.

8. A method for internally calibrating a mixed-signal electronic device, as claim 1 or 2 where multiple resistors are replaced with resistor ladders, that provide critical functionalities of the device.

* * * * *